United States Patent
Ku et al.

(10) Patent No.: US 12,400,696 B2
(45) Date of Patent: Aug. 26, 2025

(54) MEMORY DEVICE PERFORMING PRECHARGE OPERATION, AND OPERATING METHOD THEREOF

(71) Applicant: SK hynix Inc., Gyeonggi-do (KR)

(72) Inventors: Sang Hyun Ku, Gyeonggi-do (KR); Do Hong Kim, Gyeonggi-do (KR); Duck Hwa Hong, Gyeonggi-do (KR); Min Ho Seok, Gyeonggi-do (KR); So Yoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 189 days.

(21) Appl. No.: 18/358,026

(22) Filed: Jul. 25, 2023

(65) Prior Publication Data

US 2024/0312503 A1  Sep. 19, 2024

(30) Foreign Application Priority Data

Mar. 14, 2023  (KR) ........................ 10-2023-0032905

(51) Int. Cl.
*G11C 8/08* (2006.01)
(52) U.S. Cl.
CPC ...................................... *G11C 8/08* (2013.01)
(58) Field of Classification Search
CPC ........................................................ G11C 8/08
See application file for complete search history.

(56) References Cited

U.S. PATENT DOCUMENTS

| | | | | |
|---|---|---|---|---|
| 7,920,429 | B2 * | 4/2011 | Chi ..................... | G11C 11/4085 365/185.23 |
| 8,363,507 | B2 * | 1/2013 | Cho ....................... | G11C 8/08 365/189.11 |
| 10,854,273 | B1 * | 12/2020 | Sato ........................ | G11C 8/10 |
| 2021/0012819 | A1 | 1/2021 | Suzuki | |
| 2021/0151092 | A1 | 5/2021 | Lee | |

FOREIGN PATENT DOCUMENTS

KR  10-2022-0104867 A  7/2022

\* cited by examiner

*Primary Examiner* — Vanthu T Nguyen
(74) *Attorney, Agent, or Firm* — IP & T GROUP LLP

(57) ABSTRACT

A memory device includes a plurality of word lines; and a row control circuit configured to: drive, in response to a precharge command, a selected word line of the word lines such that a voltage level of the selected word line decreases from a first voltage level to a second voltage level during a first section, stays at the second voltage level during a second section and decreases from the second voltage level to a third voltage level during a third section, and keep the second section at a preset time amount, or change the second section to a time amount defined by an input of an active command according to a mode control signal.

19 Claims, 16 Drawing Sheets

MEMORY DEVICE PERFORMING PRECHARGE OPERATION, AND OPERATING METHOD THEREOF

CROSS-REFERENCE TO RELATED APPLICATION

The present application claims priority under 35 U.S.C. § 119(a) to Korean Patent Application No. 10-2023-0032905, filed on Mar. 14, 2023, which is incorporated herein by reference in its entirety.

BACKGROUND

1. Field

Various embodiments of the present invention relate to a semiconductor design technology, and more particularly, to a memory device that performs a precharge operation for row-hammer mitigation.

2. Description of the Related Art

As the degree of integration of a memory device increases, an interval between a plurality of word lines included in the memory device decreases. As the interval between the plurality of word lines decreases, a coupling effect between adjacent word lines is increasing.

Whenever data is input and output to a memory cell, the word line toggles between an active state and an inactive state, and as described above, the coupling effect between adjacent word lines increases, and data of memory cells connected to the frequently active word lines are damaged. This phenomenon is called a row hammer, and various methods for mitigating the effect of a row hammer are being studied.

SUMMARY

Embodiments of the present invention are directed to a memory device capable of adjusting an intermediate voltage level section during a precharge operation on a word line, and an operating method thereof.

According to an embodiment of the present invention, a memory device includes a plurality of word lines; and a row control circuit configured to: drive, in response to a precharge command, a selected word line of the word lines such that a voltage level of the selected word line decreases from a first voltage level to a second voltage level during a first section, stays at the second voltage level during a second section and decreases from the second voltage level to a third voltage level during a third section, and keep the second section at a preset time amount, or change the second section to a time amount defined by an input of an active command according to a mode control signal.

According to an embodiment of the present invention, a memory device includes a row active circuit configured to generate a row active signal that is activated in response to an active command and deactivated in response to a precharge command; a section control circuit configured to: generate a section start signal that stays activated during a first section from when the row active signal is deactivated, and generate a first section end signal or a second section end signal in response to a mode control signal, wherein the first section end signal becomes activated after a preset time amount from deactivation of the section start signal, and wherein the second section end signal stays activated during a predetermined period from when the row active signal is activated; and a driving control circuit configured to generate driving control signals for driving, to a second voltage level, a selected word line of word lines during a second section defined by the section start signal, the first section end signal and the second section end signal.

According to an embodiment of the present invention, an operating method of a memory device includes driving a word line according to a precharge command such that a voltage level of the word line decreases from a first voltage level to a second voltage level during a first section; driving the word line such that the voltage level of the word line stays at the second voltage level during a second section after the first section; keeping an amount of the second section to a preset time amount or changing the amount as defined by an active command, according to a mode control signal; and driving the word line such that the voltage level of the word line decreases from the second voltage level to a third voltage level during a third section.

According to an embodiment of the present invention, a memory device includes a plurality of word lines; and a row control circuit configured to: drive, in response to a precharge command, a selected word line of the word lines such that a voltage level of the selected word line decreases from a first voltage level to a second voltage level during a first section, stays at the second voltage level during a second section and decreases from the second voltage level to a third voltage level during a third section, and change, according to a first mode control signal and a second mode control signal, an amount of the second section as defined by an active command.

According to embodiments of the present invention, the memory device may adjust, depending on an operation mode, the intermediate voltage level section during the precharge operation, thereby preventing a fail due to a lack of margin of a precharge-active time tRP while mitigating the row hammer phenomenon.

DETAILED DESCRIPTION

Figure 1A:
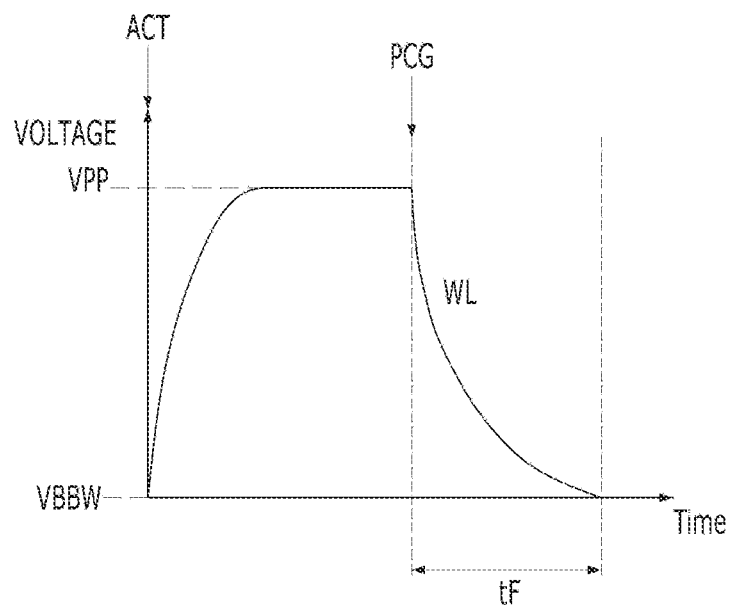
FIGS. 1A and 1B are waveform diagrams for describing a soft-landing scheme according to an embodiment of the present invention.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Figure 1B:
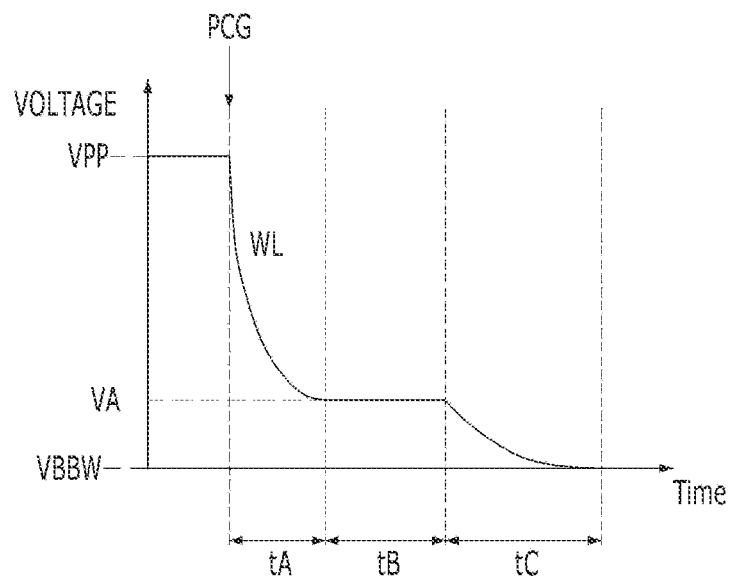

FIGS. 1A and 1B are waveform diagrams for describing a soft-landing scheme according to an embodiment of the present invention.

Referring to FIG. 1A, when an active command ACT is applied for an access operation such as a read operation and a write operation of a memory device, a voltage VPP is applied to a selected word line WL. When a precharge command PCG is applied, the selected word line WL is driven at a low voltage VBBW having a voltage level lower than the high voltage VPP. Therefore, a voltage level of the word line WL may exponentially decrease from a high voltage level VPP to a low voltage level VBBW according to an exponential curve.

At this time, a falling time tF in which the voltage level of the word line WL decreases from the high voltage level VPP to the low voltage level VBBW may affect the row hammer characteristics. The row hammer characteristics of adjacent word lines may deteriorate as the voltage level changes rapidly from the high voltage level VPP to the low voltage level VBBW. That is, as the falling time tF is shortened, the row hammer characteristic deterioration occurs.

Referring to FIG. 1B, a soft-landing scheme is proposed as a way to reduce the impact on the row hammer during a precharge operation. The soft-landing scheme may reduce the row hammer effect by slowing the precharge of the word line WL or by maintaining or keeping the word line WL at an intermediate voltage level VA for a certain amount of time before being discharged to the low voltage level VBBW, during the precharge operation.

That is, as described in FIG. 1B, for the soft-landing scheme, the precharge operation may be performed such that a voltage level of the word line WL decreases from the high voltage level VPP to the intermediate voltage level VA during a first section tA, stays at the intermediate voltage level VA during a second section tB and decreases from the intermediate voltage level VA to the low voltage level VBBW during a third section tC. At this time, a greater amount of the second section tB may improve the row hammer characteristics, but it is difficult to secure the amount of the third section tC when the subsequent active command ACT is applied, which causes a failure (hereinafter referred to as "tRP logic failure") due to a lack of margin for an internal operation that is performed according to a precharge-active time tRP.

Hereinafter, described will be a method of preventing the tRP logic failure and mitigating the row hammer during the precharge operation by adjusting, depending on an operation mode, the second section tB in which the voltage level of the word line WL stays at the intermediate voltage level VA, according to an embodiment of the present invention.

Figure 2:
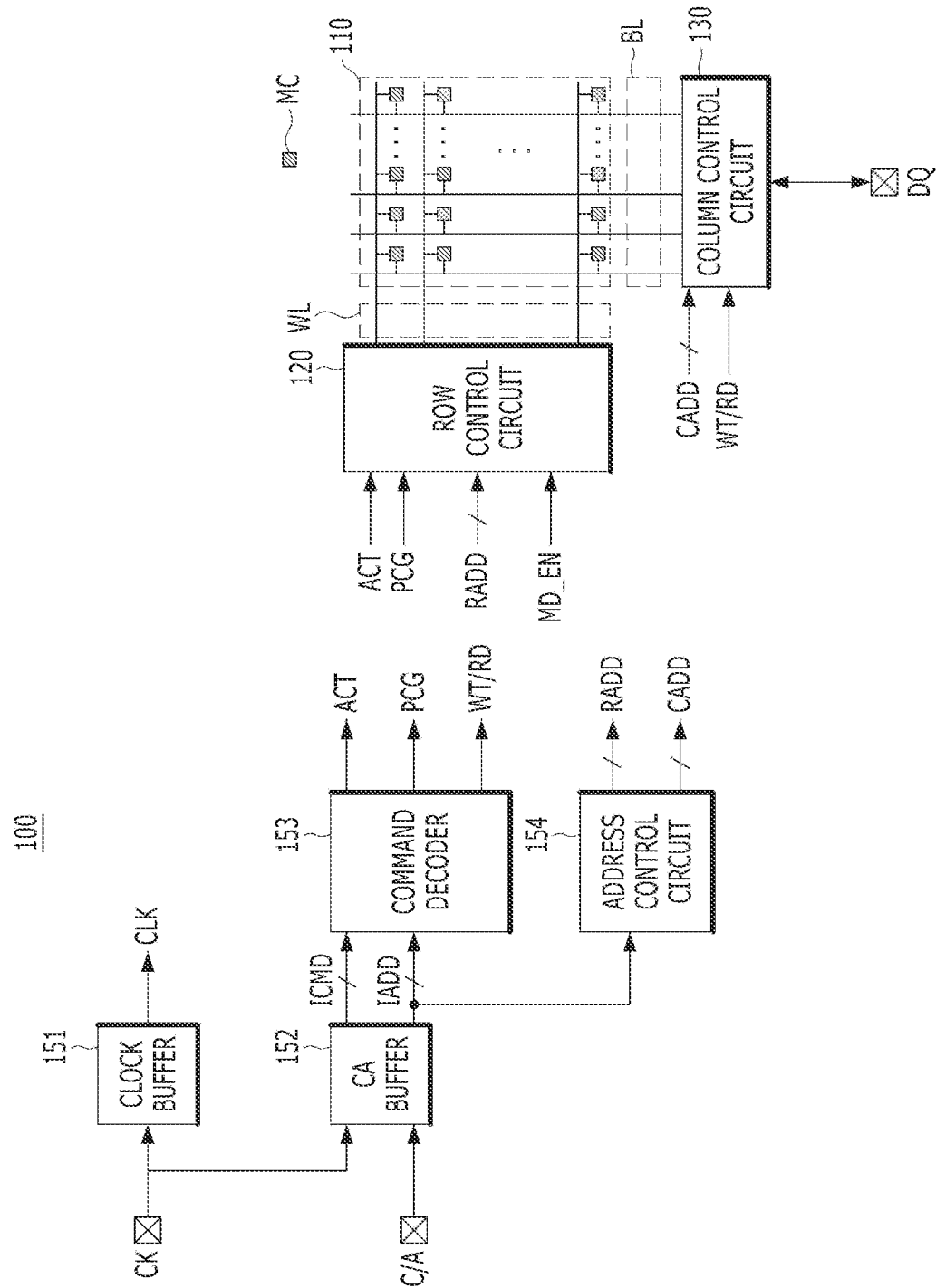
FIG. 2 is a block diagram illustrating a memory device in accordance with an embodiment of the present invention.

FIG. 2 is a block diagram illustrating a memory device 100 in accordance with an embodiment of the present invention.

Referring to FIG. 2, the memory device 100 may include a memory cell region 110, a row control circuit 120, a column control circuit 130, a clock buffer 151, a command/address (CA) buffer 152, a command decoder 153, and an address control 154.

The memory cell region 110 may include a plurality of memory cells MC coupled to a plurality of word lines WL and a plurality of bit lines BL may be arranged in the form of an array. The memory cell region 110 may be composed of at least one bank. The number of banks or the number of memory cells MC may be determined depending on the capacity of the memory device 100.

The clock buffer 151 may receive a clock CK from an external device (e.g., a memory controller). The clock buffer 151 may generate an internal clock CLK by buffering the clock CK. Depending on an embodiment, the memory controller may transfer system clocks to the memory device 100 in a differential manner, and the memory device 100 may include clock buffers that receive the differential clocks, respectively.

The CA buffer 152 may receive a command/address signal C/A from the memory controller 200 based on the clock CK. The CA buffer 152 may sample the command/address signal C/A based on the clock CK and output an internal command ICMD and an internal address IADD. Consequently, the memory device 100 may be synchronized with the clock CK.

The command decoder 153 may decode the internal command ICMD which is output from the CA buffer 152 to generate an active command ACT, a precharge command PCG, a read command RD and a write command WT. Although not illustrated, the command decoder 153 may additionally generate a refresh command, a mode register command, and the like by decoding the internal command ICMD.

The address control circuit 154 may classify the internal address IADD received from the CA buffer 152 as a row address RADD or a column address CADD. Depending on an embodiment, the address control circuit 154 may classify some bits of the internal address IADD as a row address RADD and classify the remaining bits as a column address CADD. The address control circuit 154 may classify the internal address IADD as a row address RADD when an active operation is directed as a result of the decoding by the command decoder 153 and may classify the internal address IADD as a column address CADD when a read or write operation is directed.

The row control circuit 120 may perform an active operation of activating a word line WL selected by the internal address IADD according to the active command ACT and may perform a precharge operation of precharging the selected word line WL according to the precharge command PCG. In particular, as described in FIG. 1B, during the precharge operation, the row control circuit 120 may drive the selected word line WL such that a voltage level of the word line WL decreases from the high voltage level VPP to the intermediate voltage level VA during a first section tA, stays at the intermediate voltage level VA during a second section tB and decreases from the intermediate voltage level VA to the low voltage level VBBW during a third section tC. According to an embodiment, the row control circuit 120 may keep a time amount of the second section tB to a preset time amount or change the second section tB to a time amount defined by an input of a subsequent active command ACT according to a mode control signal MD_EN.

The mode control signal MD_EN may be a signal that is deactivated when the precharge command PCG and the active command ACT are input at a predetermined interval. That is, the mode control signal MD_EN may stay deactivated to a logic low level during a normal operation in which the active command ACT lags the precharge command PCG by a precharge-active time tRP defined in the specification. On the other hand, the mode control signal MD_EN may stay activated to a logic high level during a test operation in which the precharge command PCG and the active command ACT are input without considering an interval between the precharge-active time tRP. The preset time amount may be a preset value in consideration of a margin of an internal operation according to the precharge-active time tRP. A detailed configuration and operation of the row control circuit 120 will be described with reference to FIGS. 3 to 12B.

The column control circuit 130 may select a predetermined number of the bit lines BL corresponding to the column address CADD, and input and output data DQ between the selected bit lines BL and a data pad, according to the read command RD or the write command WT. For example, the column control circuit 130 may include a column selection circuit and a data input/output circuit. The column selection circuit may decode the column address CADD to select a predetermined number of the bit lines BL. The data input/output circuit may receive the data DQ to be written to the memory cell region 110 during a write operation according to the write command WT and may transmit the data DQ read from the memory cell region 110 during a read operation according to the read command RD.

Figure 3:
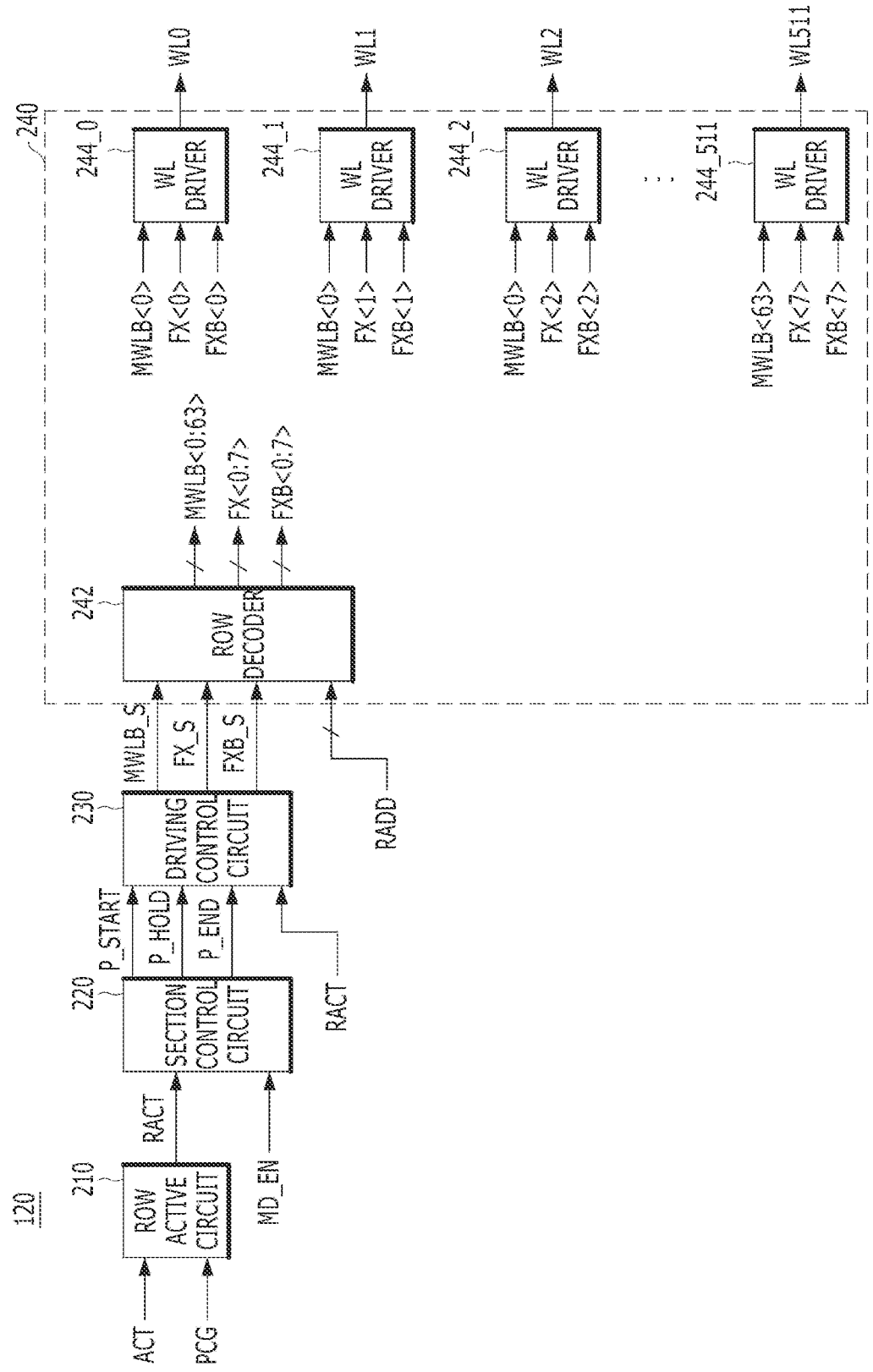
FIG. 3 is a detailed block diagram illustrating a row control circuit of FIG. 2.

FIG. 3 is a detailed block diagram illustrating the row control circuit 120 of FIG. 2.

Referring to FIG. 3, the row control circuit 120 may include a row active circuit 210, a section control circuit 220, a driving control circuit 230, and a word line driving circuit 240.

The row active circuit 210 may generate a row active signal RACT according to the active command ACT and the precharge command PCG. The row active circuit 210 may generate the row active signal RACT that is activated according to the active command ACT and deactivated according to the precharge command PCG. Depending on an embodiment, the row active circuit 210 may additionally receive a refresh command to generate the row active signal RACT that is activated according to the refresh command and deactivated after a minimum time of a row address strobe tRASmin. The row active signal RACT may be a signal for activating (or selecting) at least one word line among the word lines WL (e.g., first to 512th word lines WL0 to WL511).

The section control circuit 220 may generate a section start signal P_START, a first section end signal P_HOLD, and a second section end signal P_END according to the row active signal RACT and the mode control signal MD_EN. The section control circuit 220 may generate the section start signal P_START that stays activated during the first section tA from when the row active signal RACT is deactivated according to the input of the precharge command PCG. In response to the mode control signal MD_EN, the section control circuit 220 may generate the first section end signal P_HOLD that is activated after the preset time amount from deactivation of the section start signal P_START, or the second section end signal P_END that stays activated during a predetermined period from when the row active signal RACT is activated according to the input of the active command ACT. When the mode control signal MD_EN is deactivated, the section control circuit 220 may activate the first section end signal P_HOLD after the preset time amount from the deactivation of the section start signal P_START. When the mode control signal MD_EN is activated, the section control circuit 220 may activate the second section end signal P_END for the predetermined period from the input of the active command ACT.

That is, the first section end signal P_HOLD may be activated when the mode control signal MD_EN is deactivated, and the second section end signal P_END may be activated when the mode control signal MD_EN is activated. Hereinafter, a case in which the section start signal P_START is activated to a logic high level, and the first section end signal P_HOLD and the second section end signal P_END are activated to a logic low level, will be described as an example. A detailed configuration and operation of the section control circuit 220 will be described with reference to FIGS. 6 to 10B.

The driving control circuit 230 may generate driving control signals MWLB_S, FX_S, and FXB_S for driving the selected word line WL among the first to 512th word lines WL0 to WL511, according to the section start signal P_START, the first section end signal P_HOLD, and the second section end signal P_END. The driving control circuit 230 may generate the driving control signals MWLB_S, FX_S, and FXB_S to drive the selected word line WL at the intermediate voltage level VA during the second section tB defined by the section start signal P_START, the first section end signal P_HOLD, and the second section end signal P_END. The driving control signals MWLB_S, FX_S, and FXB_S may include a main driving signal MWLB_S, a first sub-driving signal FX_S, and a second sub-driving signal FXB_S. The driving control circuit 230 may generate the second sub-driving signal FXB_S based on the first section end signal P_HOLD and the second section end signal P_END. The driving control circuit 230 may generate the main driving signal MWLB_S based on the section start signal P_START and the second sub-driving signal FXB_S. The driving control circuit 230 may generate the first sub-driving signal FX_S based on the row active signal RACT and the second sub-driving signal FXB_S. A detailed configuration of the driving control circuit 230 will be described with reference to FIG. 11.

The word line driving circuit 240 may drive a word line WL corresponding to the row address RADD according to the main driving signal MWLB_S, the first sub-driving signal FX_S, and the second sub-driving signal FXB_S.

The word line driving circuit 240 may include a row decoder 242 and first to 512th word line (WL) drivers 244_0 to 244_511.

The row decoder 242 may decode the row address RADD to select at least one word line from the first to 512th word lines WL0 to WL511 and may generate a dedicated main driving signal MWLB<0:63>, a first dedicated sub-driving signal FX<0:7> and a second dedicated sub-driving signal FXB<0:7> to drive the selected word line. For example, as shown in Table 1 below, the 64-bit dedicated main driving signal MWLB<0:63>, the 8-bit first dedicated sub-driving signal FX<0:7>, and the 8-bit second dedicated sub-driving signal FXB<0:7> may be used to control activation and deactivation of the first to 512th word lines WL0 to WL511 in combination of 64*8.

TABLE 1

| WL0 | MWLB<0> | FX<0>, FXB<0> |
|---|---|---|
| WL1 | MWLB<0> | FX<1>, FXB<1> |
| WL2 | MWLB<0> | FX<2>, FXB<2> |
| WL3 | MWLB<0> | FX<3>, FXB<3> |
| WL4 | MWLB<0> | FX<4>, FXB<4> |
| WL5 | MWLB<0> | FX<5>, FXB<5> |
| WL6 | MWLB<0> | FX<6>, FXB<6> |
| WL7 | MWLB<0> | FX<7>, FXB<7> |
| WL8 | MWLB<1> | FX<0>, FXB<0> |
| WL9 | MWLB<1> | FX<1>, FXB<1> |
| WL10 | MWLB<1> | FX<2>, FXB<2> |
| WL11 | MWLB<1> | FX<3>, FXB<3> |
| WL12 | MWLB<1> | FX<4>, FXB<4> |
| WL13 | MWLB<1> | FX<5>, FXB<5> |
| WL14 | MWLB<1> | FX<6>, FXB<6> |
| WL15 | MWLB<1> | FX<7>, FXB<7> |
| WL16 | MWLB<2> | FX<0>, FXB<0> |
| WL17 | MWLB<2> | FX<1>, FXB<1> |
| ... | ... | ... |
| WL510 | MWLB<63> | FX<6>, FXB<6> |
| WL511 | MWLB<63> | FX<7>, FXB<7> |

Referring to Table 1, it may be seen that the activation and deactivation of the fourth word line WL3 may be controlled based on the dedicated main driving signal MWLB<0>, the first dedicated sub-driving signal FX<3>, and the second dedicated sub-driving signal FXB<3>, and the activation and deactivation of the 18th word line WL17 may be controlled based on the dedicated main driving signal MWLB<2>, the first dedicated sub-driving signal FX<1>, and the second dedicated sub-driving signal FXB<1>. The number of word lines described in the above embodiment and the number of bits of driving signals are only one example, and the present invention is not limited thereto, and various word lines may be driven depending on a combination of bits of dedicated driving signals.

The first to 512th word line drivers 244_0 to 244_511 may respectively drive the first to 512th word lines WL0 to WL511 in response to the dedicated main driving signal MWLB<0:63>, the first dedicated sub-driving signal FX<0:7> and the second dedicated sub-driving signal FXB<0:7>. The first to 512th word line drivers 244_0 to 244_511 may respectively correspond to the first to 512th word lines WL0 to WL511 and may drive corresponding word lines according to corresponding dedicated driving signals, as shown in Table 1.

Figure 4:
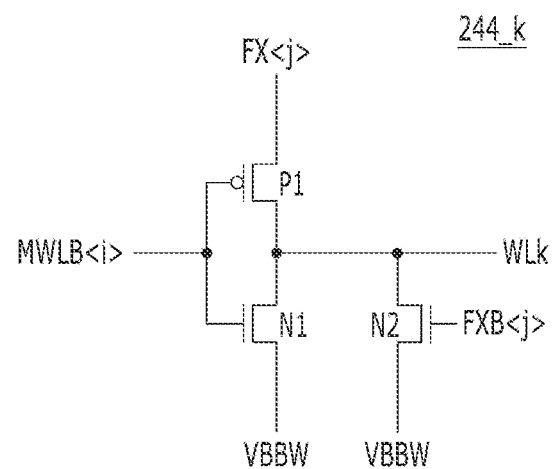
FIG. 4 is a circuit diagram illustrating a word line driver of FIG. 3.

FIG. 4 is a circuit diagram illustrating a word line driver 244_k among the first to 512th word line drivers 244_0 to 244_511 of FIG. 3.

Referring to FIG. 4, the word line driver 244_k may include a PMOS transistor P1 and first and second NMOS transistors N1 and N2. In FIG. 4, i may be an arbitrary integer of 0 to 63, and j may be an arbitrary integer of 0 to 7, and k may be an arbitrary integer of 0 to 511.

The PMOS transistor P1 may drive a word line WLk to a voltage level of the first dedicated sub-driving signal FX<j> in response to the dedicated main driving signal MWLB<i>. The first NMOS transistor N1 may drive the word line WLk to a low voltage level VBBW in response to the dedicated main driving signal MWLB<i>. Also, the second NMOS transistor N2 may drive the word line WLk to the low voltage level VBBW in response to the second dedicated sub-driving signal FXB<j>.

Figure 5A:
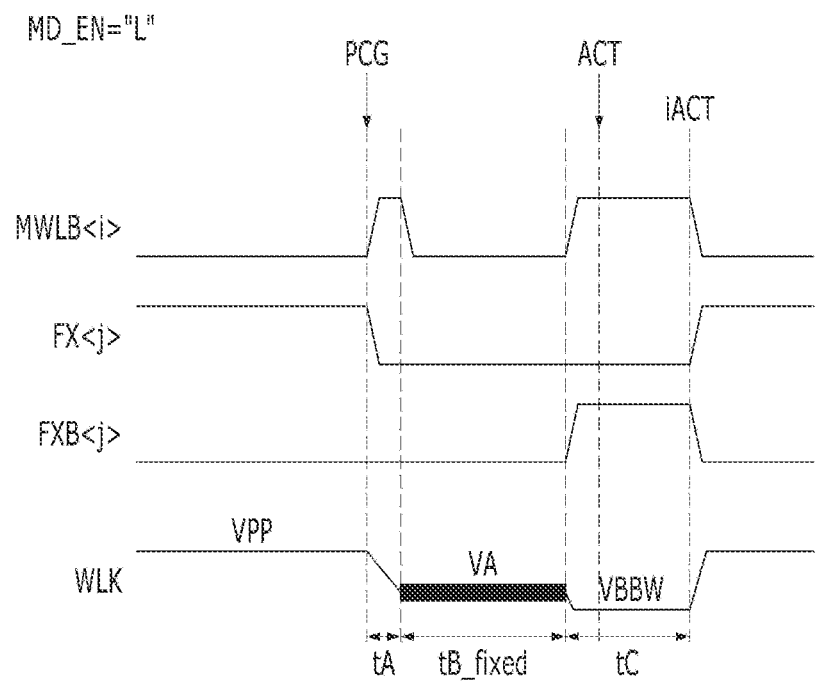
FIGS. 5A and 5B are waveform diagrams for describing an operation of a word line driver according to a mode control signal, in accordance with an embodiment of the present invention.
Figure 5B:
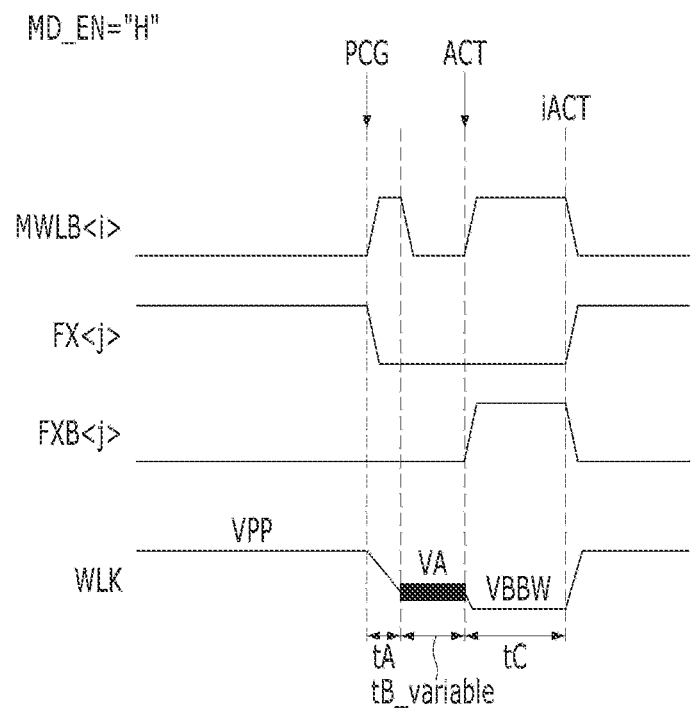

FIGS. 5A and 5B are waveform diagrams for describing an operation of the word line driver 244_k according to the mode control signal MD_EN in accordance with an embodiment of the present invention.

Referring to FIG. 5A, when the mode control signal MD_EN is deactivated to a logic low level, an operation of the word line driver 244_k is illustrated. In this case, the active command ACT lags the precharge command PCG by the precharge-active time tRP defined in the specification.

When the active command ACT is input, the row active signal RACT is activated to a logic high level, and accordingly, an active pulse iACT is generated internally to start an active operation. According to the active pulse iACT, the dedicated main driving signal MWLB<i> and the second dedicated sub-driving signal FXB<j> transition to a logic low level, and the first dedicated sub-driving signal FX<j> transitions to a logic high level. Accordingly, the PMOS transistor P1 of the word line driver 244_k is turned on so that the word line WLk may be activated to a high voltage level VPP.

When the precharge command PCG is input, the row active signal RACT is deactivated to a logic low level, to thereby start a precharge operation. The first dedicated sub-driving signal FX<j> transitions to a logic low level and the dedicated main driving signal MWLB<i> stays at the logic high level during a first section tA. Accordingly, during the first section tA, the first NMOS transistor N1 of the word line driver 244_k is turned on so that the word line WLk may be deactivated from the high voltage level VPP to the intermediate voltage level VA. Here, the intermediate voltage level VA may be lower than the high voltage level VPP and higher than the low voltage level VBBW.

After that, as the dedicated main driving signal MWLB<i> transitions to a logic low level, the first NMOS transistor N1 of the word line driver 244_k is turned off and the PMOS transistor P1 is turned on, so that the word line WLk may maintain the intermediate voltage level VA. When the mode control signal MD_EN is deactivated to a logic low level, the word line WLk may maintain the intermediate voltage level VA for a preset time amount (i.e., a second section tB_fixed) in consideration of the precharge-active time tRP.

After that, as the dedicated main driving signal MWLB<i> and the second dedicated sub-driving signal FXB<j> transition to a logic high level, both the first and second NMOS transistors N1 and N2 are turned on, and the word line WLK of the intermediate voltage level VA may be discharged/precharged to the low voltage level VBBW. When a subsequent active command ACT is input, the word line WLk may be driven through the above processes. At this time, as the active pulse iACT is internally generated after the subsequent active command ACT is input, a third section tC in which the word line WLk is discharged/precharged to the low voltage level VBBW may be defined.

As described above, when the mode control signal MD_EN is deactivated to a logic low level, the word line driver 244_k may maintain the word line WLk at the intermediate voltage level VA for the second section tB_fixed, which is a time amount preset in consideration of the precharge-active time tRP.

Referring to FIG. 5B, when the mode control signal MD_EN is activated to a logic high level, an operation of the word line driver 244_k is illustrated. In this case, the precharge command PCG and the active command ACT are input at any interval shorter than or longer than the precharge-active time tRP defined in the specification.

When the active command ACT is input, the PMOS transistor P1 is turned on so that the word line WLk may be activated to a high voltage level VPP.

When the precharge command PCG is input, the first NMOS transistor N1 is turned on so that the word line WLk may be deactivated from the high voltage level VPP to the intermediate voltage level VA.

After that, as the dedicated main driving signal MWLB<i> transitions to a logic low level, the first NMOS transistor N1 is turned off and the PMOS transistor P1 is turned on, so that the word line WLk may maintain the intermediate voltage level VA.

At this time, when a subsequent active command ACT is input, the dedicated main driving signal MWLB<i> and the second dedicated sub-driving signal FXB<j> transition to a logic high level, and thus, both the first and second NMOS transistors N1 and N2 are turned on. Thus, the word line WLK of the intermediate voltage level VA may be discharged/precharged to the low voltage level VBBW. Accordingly, a second section tB_variable in which the word line WLk maintains the intermediate voltage level VA may be defined. That is, when the mode control signal MD_EN is activated, the second section tB_variable may be variable and have a time amount defined by an input of the subsequent active command ACT.

After the word line WLk stays at the low voltage level VBBW during a third section tC, an active pulse iACT may be internally generated to start an active operation. The word line WLk may be activated again to the high voltage level VPP according to the active pulse iACT.

As described above, when the mode control signal MD_EN is activated to a logic high level, the word line driver 244_k may adjust the second section tB_variable according to the subsequent active command ACT thereby keeping the voltage level of the word line WLk at the intermediate voltage level VA during the second section tB_variable and then keeping the voltage level of the word line WLk at the low voltage level VBBW during the third section tC. Accordingly, it is possible to alleviate the row hammer by using the soft-landing scheme while preventing the tRP logic failure.

Hereinafter, a detailed configuration of the section control circuit 220 and the driving control circuit 230 according to an embodiment of the present invention will be described with reference to the drawings.

Figure 6:
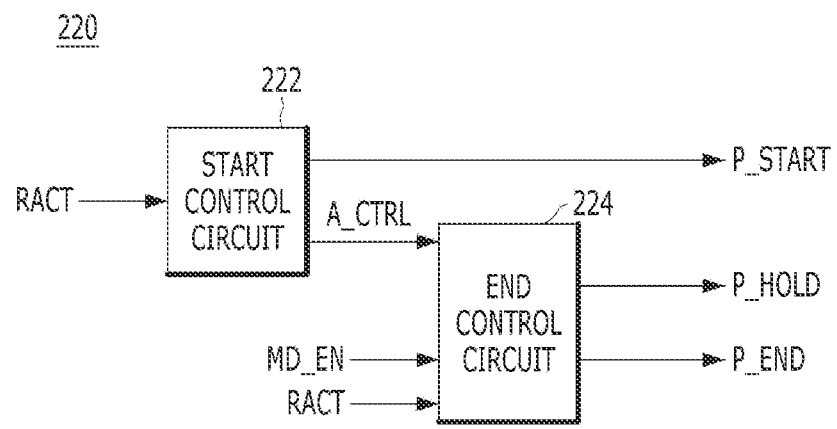
FIG. 6 is a detailed block diagram illustrating a section control circuit of FIG. 3.
Figure 7A:
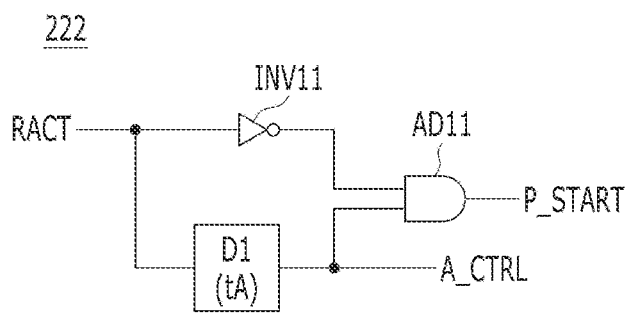
FIGS. 7A and 7B are a circuit diagram and a waveform diagram illustrating a start control circuit of FIG. 6.
Figure 7B:
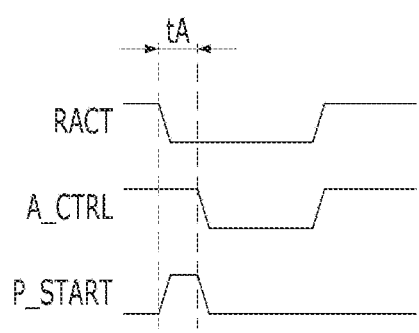

FIG. 6 is a detailed block diagram illustrating the section control circuit 220 of FIG. 3. FIGS. 7A and 7B are a circuit diagram and a waveform diagram illustrating a start control circuit 222 of FIG. 6.

Referring to FIG. 6, the section control circuit 220 may include the start control circuit 222 and an end control circuit 224.

The start control circuit 222 may generate the section start signal P_START according to the row active signal RACT. The start control circuit 222 may generate a first section signal A_CTRL by delaying the row active signal RACT by the first section tA. The start control circuit 222 may generate, according to the row active signal RACT and the first section signal A_CTRL, the section start signal P_START that stays activated during the first section tA.

For example, referring to FIG. 7A, the start control circuit 222 may include an inverter INV11, a delay circuit D1, and an AND gate AD11. The inverter INV11 may invert the row active signal RACT. The delay circuit D1 may delay the row active signal RACT by the first section tA to generate the first section signal A_CTRL. Preferably, the delay circuit D1 may be implemented with an RC delay circuit that delays only a falling edge of the row active signal RACT by the first section tA. The AND gate AD11 may output the section start signal P_START by performing a logic AND operation on an output of the inverter INV11 and an output (i.e., the first section signal A_CTRL) of the delay circuit D1. Accordingly, as shown in FIG. 7B, the start control circuit 222 may generate the first section signal A_CTRL that becomes a logic low level after the first section tA from the falling edge of the row active signal RACT and becomes a logic high level at a rising edge of the row active signal RACT. In addition, the start control circuit 222 may generate the section start signal P_START that stays activated during the first section tA between the falling edge of the row active signal RACT and a falling edge of the first section signal A_CTRL.

Referring back to FIG. 6, the end control circuit 224 may generate a first preliminary end signal (PRE_HOLD in FIG. 8) based on the row active signal RACT and the first section signal A_CTRL, and a second preliminary end signal (PRE_END in FIG. 8) based on the row active signal RACT. The end control circuit 224 may output the first preliminary end signal PRE_HOLD as the first section end signal P_HOLD, or the second preliminary end signal PRE_END as the second section end signal P_END, according to the mode control signal MD_EN.

Figure 8:
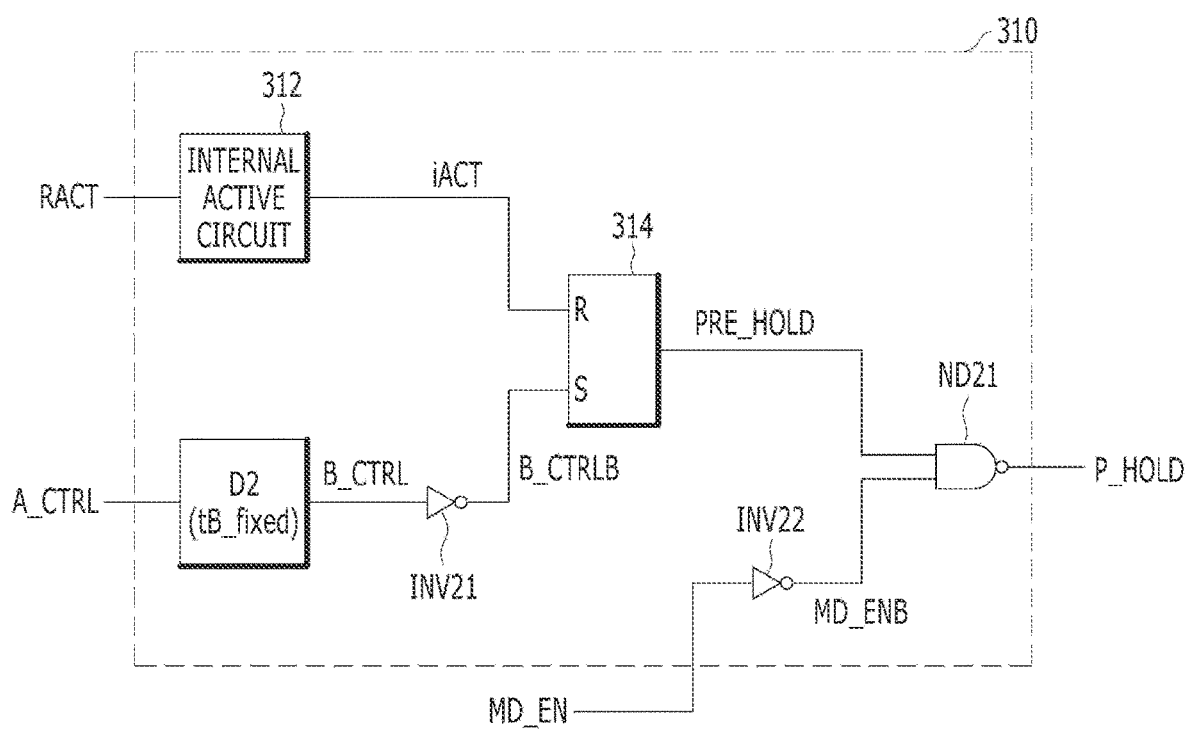
FIG. 8 is a circuit diagram illustrating an end control circuit of FIG. 6.
Figure 8:
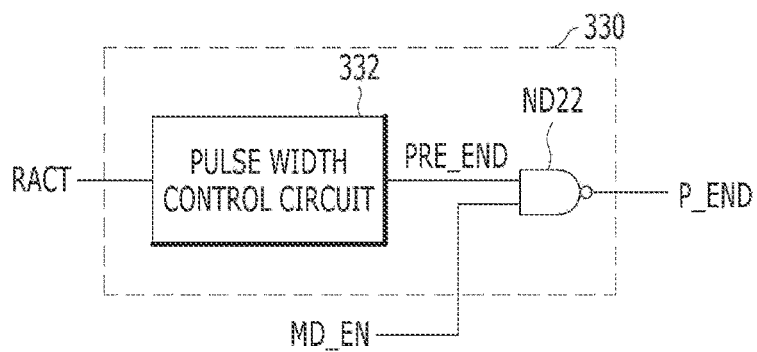
Figure 9A:
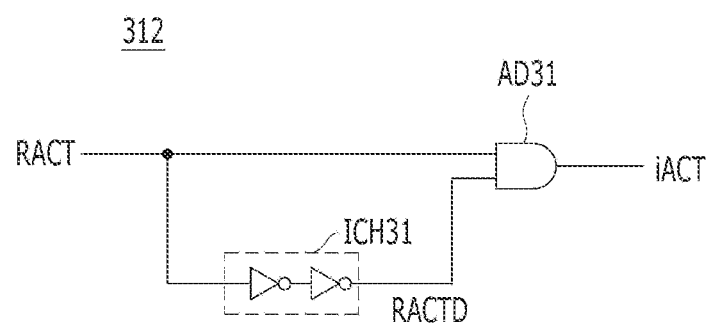
FIGS. 9A and 9B are a circuit diagram and a waveform diagram illustrating an internal active circuit of FIG. 8.
Figure 9B:
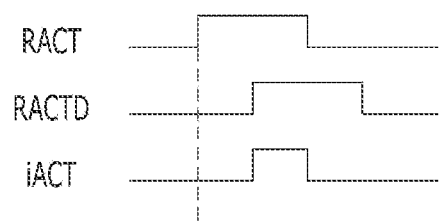
Figure 10A:
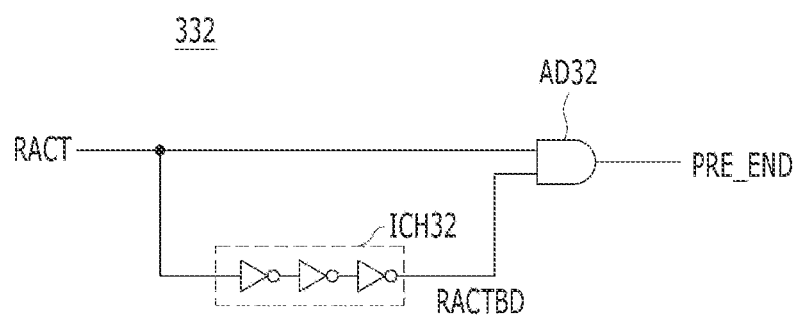
FIGS. 10A and 10B are a circuit diagram and a waveform diagram illustrating a pulse width control circuit of FIG. 8.
Figure 10B:
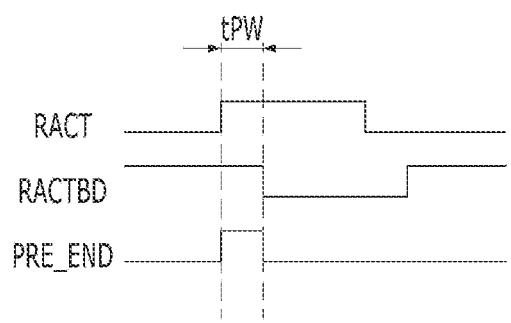

FIG. 8 is a circuit diagram illustrating the end control circuit 224 of FIG. 6. FIGS. 9A and 9B are a circuit diagram and a waveform diagram illustrating an internal active circuit 312 of FIG. 8. FIGS. 10A and 10B are a circuit diagram and a waveform diagram illustrating a pulse width control circuit 332 of FIG. 8.

Referring to FIG. 8, the end control circuit 224 may include a first end controller 310 and a second end controller 330.

The first end controller 310 may generate the first preliminary end signal PRE_HOLD based on the row active signal RACT and the first section signal A_CTRL and may mask the first preliminary end signal PRE_HOLD or output the first preliminary end signal PRE_HOLD as the first section end signal P_HOLD, according to the mode control signal MD_EN.

In detail, the first end controller 310 may include the internal active circuit 312, a delay circuit D2, an SR latch 314, a first inverter INV21, a second inverter INV22, and a first NAND gate ND21. The second inverter INV22 and the first NAND gate ND21 may be defined as a first masking circuit.

The internal active circuit 312 may generate the active pulse iACT after a predetermined time from when the row active signal RACT is activated to a logic high level. That is, the internal active circuit 312 may generate the active pulse iACT that pulses for a certain period after the predetermined time from the input of the active command ACT. Referring to FIG. 9A, the internal active circuit 312 may include an inverter chain ICH1 and an AND gate AD31. The inverter chain ICH1 may be composed of an even number of inverters to generate a delay signal RACTD by delaying the row active signal RACT for the predetermined time without phase reversal. The AND gate AD31 may output the active pulse iACT by performing a logic AND operation on the row active signal RACT and the delay signal RACTD. Accordingly, as described in FIG. 9B, the internal active circuit 312 may generate the active pulse iACT that pulses for the certain period after the predetermined time from when the row active signal RACT is activated to a logic high level.

The delay circuit D2 may delay the first section signal A_CTRL by a preset amount tB_fixed to generate a second section signal B_CTRL. Preferably, the delay circuit D2 may be implemented with an RC delay circuit that delays only a falling edge of the first section signal A_CTRL. The delay circuit D2 may generate the second section signal B_CTRL that becomes a logic low level after the second section tB from the falling edge of the first section signal A_CTRL and becomes a logic high level at a rising edge of the first section signal A_CTRL.

The first inverter INV21 may generate an inverted section signal B_CTRLB by inverting the second section signal B_CTRL.

The SR latch 314 may generate the first preliminary end signal PRE_HOLD, which is set to a logic high level according to the inverted section signal B_CTRLB and reset to a logic low level according to the active pulse iACT.

The second inverter INV22 may generate an inverted mode control signal MD_ENB by inverting the mode control signal MD_EN.

The first NAND gate ND21 may invert the first preliminary end signal PRE_HOLD according to the inverted mode control signal MD_ENB to output the first section end signal P_HOLD or keep the first section end signal P_HOLD at a specific level. When the mode control signal MD_EN is deactivated and thus the inverted mode control signal MD_ENB becomes a logic high level, the first NAND gate ND21 may output the first section end signal P_HOLD by inverting the first preliminary end signal PRE_HOLD. On the other hand, when the mode control signal MD_EN is activated and thus the inverted mode control signal MD_ENB becomes a logic low level, the first NAND gate ND21 may output the first section end signal P_HOLD kept to a logic high level.

The second end controller 330 may generate the second preliminary end signal PRE_END based on the row active signal RACT and may mask the second preliminary end signal PRE_END or output the second preliminary end signal PRE_END as the second section end signal P_END, according to the mode control signal MD_EN.

In detail, the second end controller 330 may include the pulse width control circuit 332 and a second NAND gate ND22. The second NAND gate ND22 may be defined as a second masking circuit.

The pulse width control circuit 332 may generate the second preliminary end signal PRE_END, which has a pulse width tPW corresponding to a predetermined period, when the row active signal RACT is activated to a logic high level. Referring to FIG. 10A, the pulse width control circuit 332 may include an inverter chain ICH2 and an AND gate AD32. The inverter chain ICH2 may be composed of an odd number of inverters to generate an inverted delay signal RACTBD by inverting and delaying the row active signal RACT for the predetermined period. The AND gate AD32 may output the preliminary end signal PRE_END by performing a logic AND operation on the row active signal RACT and the delay signal the row active signal RACT and the inverted delay signal RACTBD. Accordingly, as described in FIG. 10B, the pulse width control circuit 332 may generate the second preliminary end signal PRE_END, which has the pulse width tPW, when the row active signal RACT is activated to a logic high level. The pulse width tPW may correspond to the third section tC.

The second NAND gate ND22 may invert the second preliminary end signal PRE_END according to the mode control signal MD_EN to output the second end signal P_END or keep the second end signal P_END at a specific level. When the mode control signal MD_EN is activated to a logic high level, the second NAND gate ND22 may output the second section end signal P_END by inverting the second preliminary end signal PRE_END. On the other hand, when the mode control signal MD_EN is deactivated to a logic low level, the second NAND gate ND22 may output the second section end signal P_END kept to a logic high level.

Figure 11:
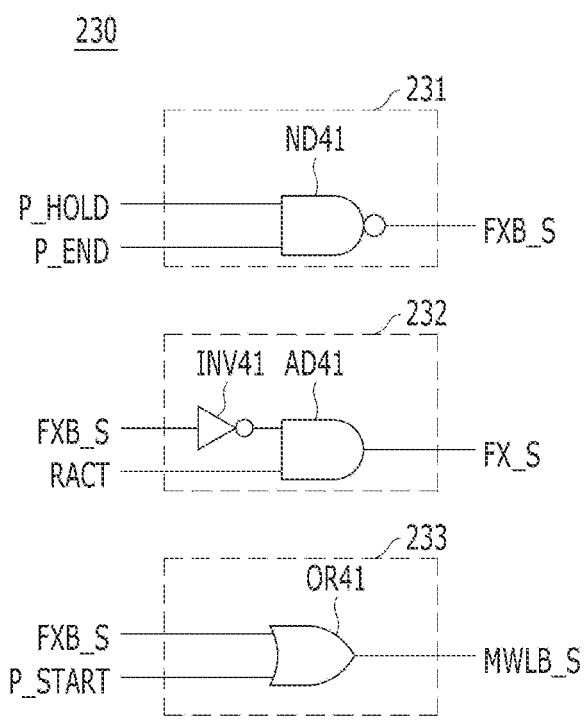
FIG. 11 is a circuit diagram illustrating a driving control circuit of FIG. 3.

FIG. 11 is a circuit diagram illustrating the driving control circuit 230 of FIG. 3.

Referring to FIG. 11, the driving control circuit 230 may include first to third driving controllers 231, 232, and 233 to generate the second sub-driving signal FXB_S, the first sub-driving signal FX_S, and the main driving signal MWLB_S, respectively. The first and second driving controllers 231 and 232 may be defined as a sub-driving control part, and the third driving controller 233 may be defined as a main driving control part.

The first driving controller 231 may generate the second sub-driving signal FXB_S according to the first section end signal P_HOLD and the second section end signal P_END. For example, the first driving controller 231 may be implemented with a NAND gate ND41 that performs a logic NAND operation on the first section end signal P_HOLD and the second section end signal P_END. With the above configuration, the first driving controller 231 may output the second sub-driving signal FXB_S to a logic high level when either the first section end signal P_HOLD or the second section end signal P_END reaches a logic low level.

The second driving controller 232 may generate the first sub-driving signal FX_S according to the row active signal RACT and the second sub-driving signal FXB_S. For example, the second driving controller 232 may include an inverter INV41 and an AND gate AD41. The inverter INV41 may invert the second sub-driving signal FXB_S. The AND gate AD41 may performs a logic NAND operation on the row active signal RACT and an output of the inverter INV41. With the above configuration, the second driving controller 232 may generate the first sub-driving signal FX_S to a logic low level when the row active signal RACT is activated and the second sub-driving signal FXB_S is deactivated.

The third driving controller 233 may generate the main driving signal MWLB_S according to the section start signal P_START and the second sub-driving signal FXB_S. For example, the third driving controller 233 may be implemented with an OR gate OR1 that performs a logic OR operation on the section start signal P_START and the second sub-driving signal FXB_S. With the above configuration, the third driving controller 233 may output the main driving signal MWLB_S to a logic high level when the section start signal P_START or the second sub-driving signal FXB_S becomes a logic high level.

Hereinafter, a method of operating the memory device 100 according to an embodiment of the present invention will be described with reference to FIGS. 3 to 12B.

Figure 12A:
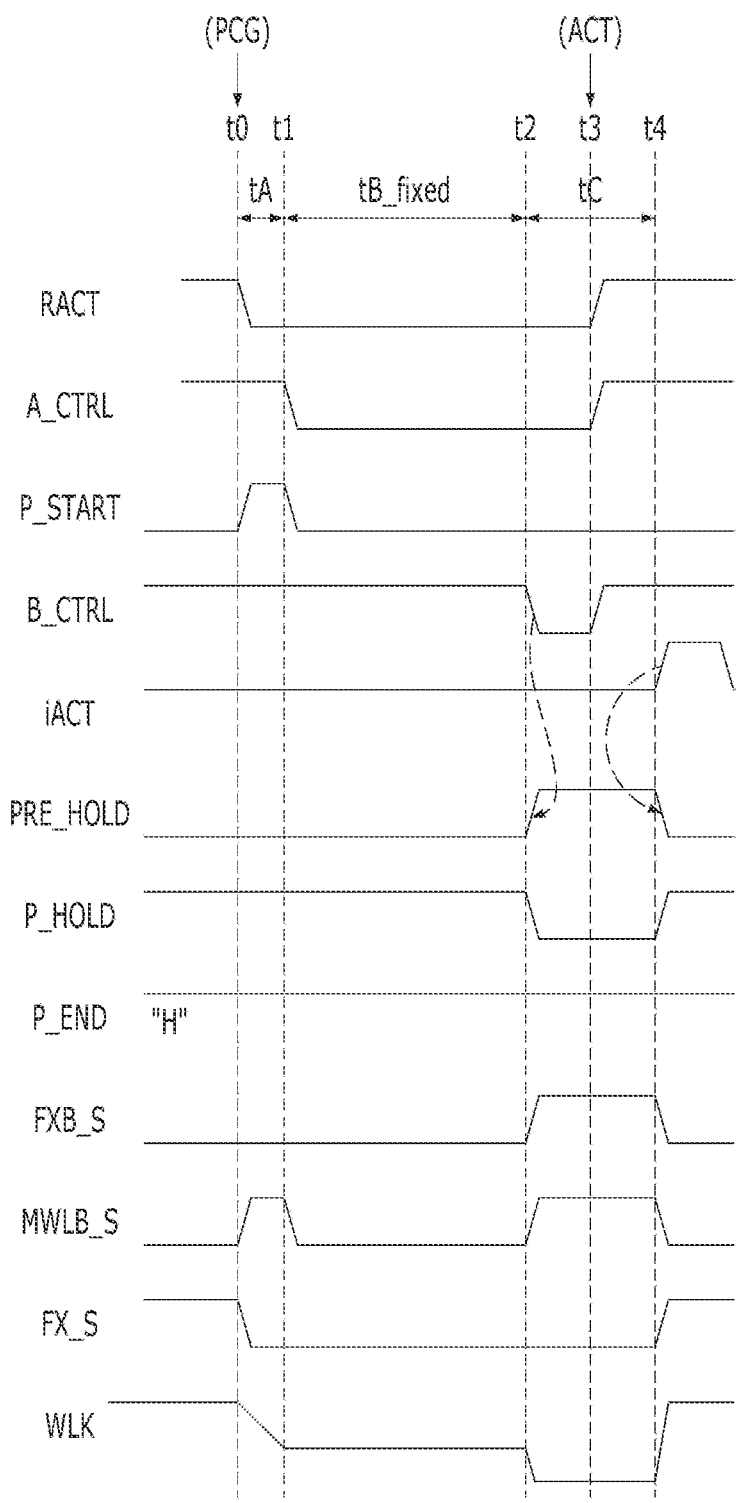
FIGS. 12A and 12B are waveform diagrams for describing an operation of a memory device according to a mode control signal in accordance with an embodiment of the present invention.
Figure 12B:
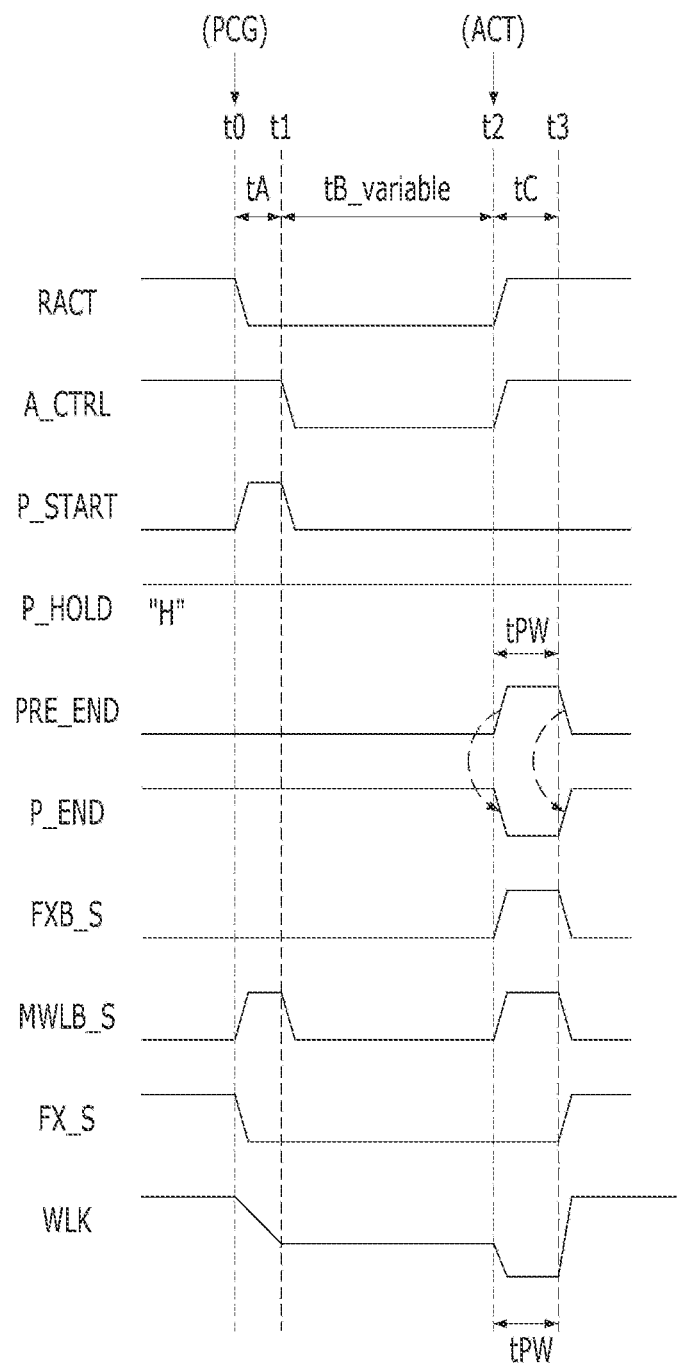

FIGS. 12A and 12B are waveform diagrams for describing an operation of the memory device 100 according to the mode control signal MD_EN, in accordance with an embodiment of the present invention.

Referring to FIG. 12A, when the mode control signal MD_EN is deactivated to a logic low level, an operation of the memory device 100 is illustrated. In this case, the active command ACT lags the precharge command PCG by the precharge-active time tRP defined in the specification.

At time to, when the precharge command PCG is input, the row active signal RACT is deactivated to a logic low level. The start control circuit 222 may delay the falling edge of the row active signal RACT by the first section tA to generate the first section signal A_CTRL and may generate, according to the row active signal RACT and the first section signal A_CTRL, the section start signal P_START that stays activated during the first section tA. Accordingly, the driving control circuit 230 may output the main driving signal MWLB_S of a logic high level during the first section tA from time t0 to time t1.

At time t1, the first end controller 310 of the end control circuit 224 may delay the falling edge of the first section signal A_CTRL by a preset time amount to generate the second section signal B_CTRL. At time t2, the first end controller 310 may set the first preliminary end signal PRE_HOLD to a logic high level. In response to the mode control signal MD_EN of a logic low level, the first end controller 310 may output the first end signal P_HOLD by inverting the first preliminary end signal PRE_HOLD, and the second end controller 330 may keep the second end signal P_END to a logic high level. The driving control circuit 230 may output the second sub-driving signal FXB_S and the main driving signal MWLB_S to a logic high level at time t2, according to the first section end signal P_HOLD of a logic low level. Accordingly, the second section tB_fixed from time t1 to time t2 may be defined.

Thereafter, when the active command ACT is input at time t3, the row active signal RACT is activated to a logic high level. The first end controller 310 may generate the active pulse iACT that pulses for a certain period after the predetermined time from the input of the active command ACT. Accordingly, at time t4, the first end controller 310 may reset the first preliminary end signal PRE_HOLD to a logic low level. The driving control circuit 230 may output, according to the first section end signal P_HOLD of a logic low level, the second sub-driving signal FXB_S and the main driving signal MWLB_S to a logic high level during the third section tC from t2 to t4. In this case, the driving control circuit 230 may output the first sub-driving signal FX_S to a logic low level from time t0 to time t4.

Then, the word line driving circuit 240 may drive the word line WLk as described in FIG. 5A.

Referring to FIG. 12B, when the mode control signal MD_EN is activated to a logic high level, an operation of the memory device 100 is illustrated. In this case, the precharge command PCG and the active command ACT may be input at arbitrary intervals.

At time to, when the precharge command PCG is input, the row active signal RACT is deactivated to a logic low level. The start control circuit 222 may generate the first section signal A_CTRL and the section start signal P_START. Accordingly, the driving control circuit 230 may output the main driving signal MWLB_S to a logic high level during the first section tA from time t0 to time t1.

At time t2, when the active command ACT is input, the row active signal RACT is activated to a logic high level. The second end controller 330 may activate the second preliminary end signal PRE_END to a logic high level. In response to the mode control signal MD_EN of a logic high level, the first end controller 310 may keep the first preliminary end signal PRE_HOLD at a logic high level, and the second end controller 330 may output the second section end signal P_END by inverting the second preliminary end signal PRE_END. The driving control circuit 230 may output the second sub-driving signal FXB_S and the main driving signal MWLB_S to a logic high level at time t2, according to the second section end signal P_END of a logic low level. Accordingly, the second section tB_variable may be defined from time t1 to time t2.

The driving control circuit 230 may output the second sub-driving signal FXB_S and the main driving signal MWLB_S to a logic high level during the third section tC from time t2 to time t3. At time t3, the second end controller 330 may deactivate the second preliminary end signal PRE_END, which has a pulse width tPW, to a logic low level. The driving control circuit 230 may output the second sub-driving signal FXB_S and the main driving signal MWLB_S to a logic low level according to the second section end signal P_END of a logic high level. In this case, the driving control circuit 230 may output the first sub-driving signal FX_S to a logic low level from time t0 to time t3.

Then, the word line driving circuit 240 may drive the word line WLk as described in FIG. 5B.

According to an embodiment of the present invention, the memory device 100 may achieve a soft-landing scheme during a precharge operation, by keeping the intermediate voltage level section (that is, the second section tB) when the mode control signal is deactivated and by changing the intermediate voltage level section when the mode control signal is activated. Accordingly, it is possible to alleviate the row hammer during the precharge operation of the word line while preventing fail caused by a lack of margin in the precharge-active time tRP.

In the above embodiment, the soft-landing scheme may be achieved such that the second section tB is kept, or variable according to a subsequent active command, depending on one mode control signal MD_EN, but the present invention is not limited thereto. In a following embodiment, a detailed configuration and operation of the end control circuit 224 for adjusting the second section tB depending on two or more mode control signals will be described.

Figure 13:
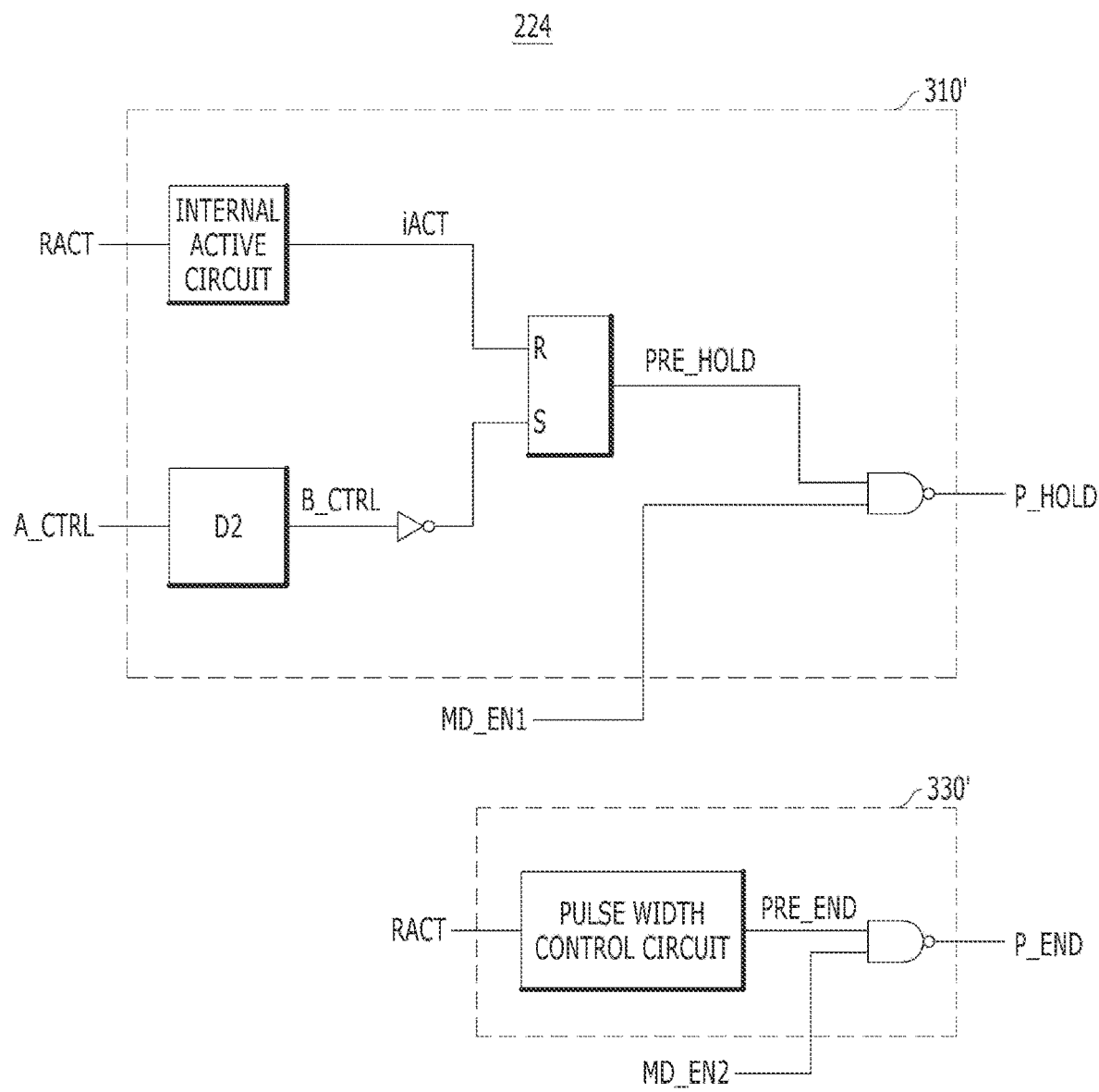
FIG. 13 is a circuit diagram illustrating an end control circuit of FIG. 6, in accordance with another embodiment of the present invention.

FIG. 13 is a circuit diagram illustrating the end control circuit 224 of FIG. 6, in accordance with another embodiment of the present invention.

Referring to FIG. 13, the end control circuit 224 may generate a first preliminary end signal PRE_HOLD based on a row active signal RACT and a first section signal A_CTRL, and a second preliminary end signal PRE_END based on the row active signal RACT. The end control circuit 224 may output the first preliminary end signal PRE_HOLD as a first section end signal P_HOLD according to a first mode control signal MD_EN1. The end control circuit 224 may output the second preliminary end signal PRE_END as a second section end signal P_END, according to a second mode control signal MD_EN2. The first mode control signal MD_EN1 and the second mode control signal MD_EN2 may be activated to a logic high level to adjust a second section tB to a time amount defined by an input of a subsequent active command ACT.

In detail, the end control circuit 224 may include a first end controller 310' and a second end controller 330'.

The first end controller 310' may generate the first preliminary end signal PRE_HOLD based on the row active signal RACT and the first section signal A_CTRL and may mask the first preliminary end signal PRE_HOLD or output the first preliminary end signal PRE_HOLD as the first section end signal P_HOLD, according to the first mode control signal MD_EN1. The first end controller 310' of FIG. 13 may have substantially the same configuration as the first end controller 310 of FIG. 8 except that the second inverter INV22 is omitted from the first end controller 310 of FIG. 8. That is, when the first mode control signal MD_EN1 is activated to a logic high level, the first end controller 310' may output the first end signal P_HOLD by inverting the first preliminary end signal PRE_HOLD. On the other hand, when the first mode control signal MD_EN1 is deactivated to a logic low level, the first end controller 310' may output the first section end signal P_HOLD kept at a logic high level.

The second end controller 330' may generate the second preliminary end signal PRE_END based on the row active signal RACT and may mask the second preliminary end signal PRE_END or output the second preliminary end signal PRE_END as the second section end signal P_END, according to the second mode control signal MD_EN2. The second end controller 330' of FIG. 13 may have substantially the same configuration as the second end controller 330 of FIG. 8. That is, when the second mode control signal MD_EN2 is activated to a logic high level, the second end controller 330' may output the second end signal P_END by inverting the second preliminary end signal PRE_END. On the other hand, when the second mode control signal MD_EN2 is deactivated to a logic low level, the second end controller 330' may output the second section end signal P_END kept at a logic high level.

Figure 14A:
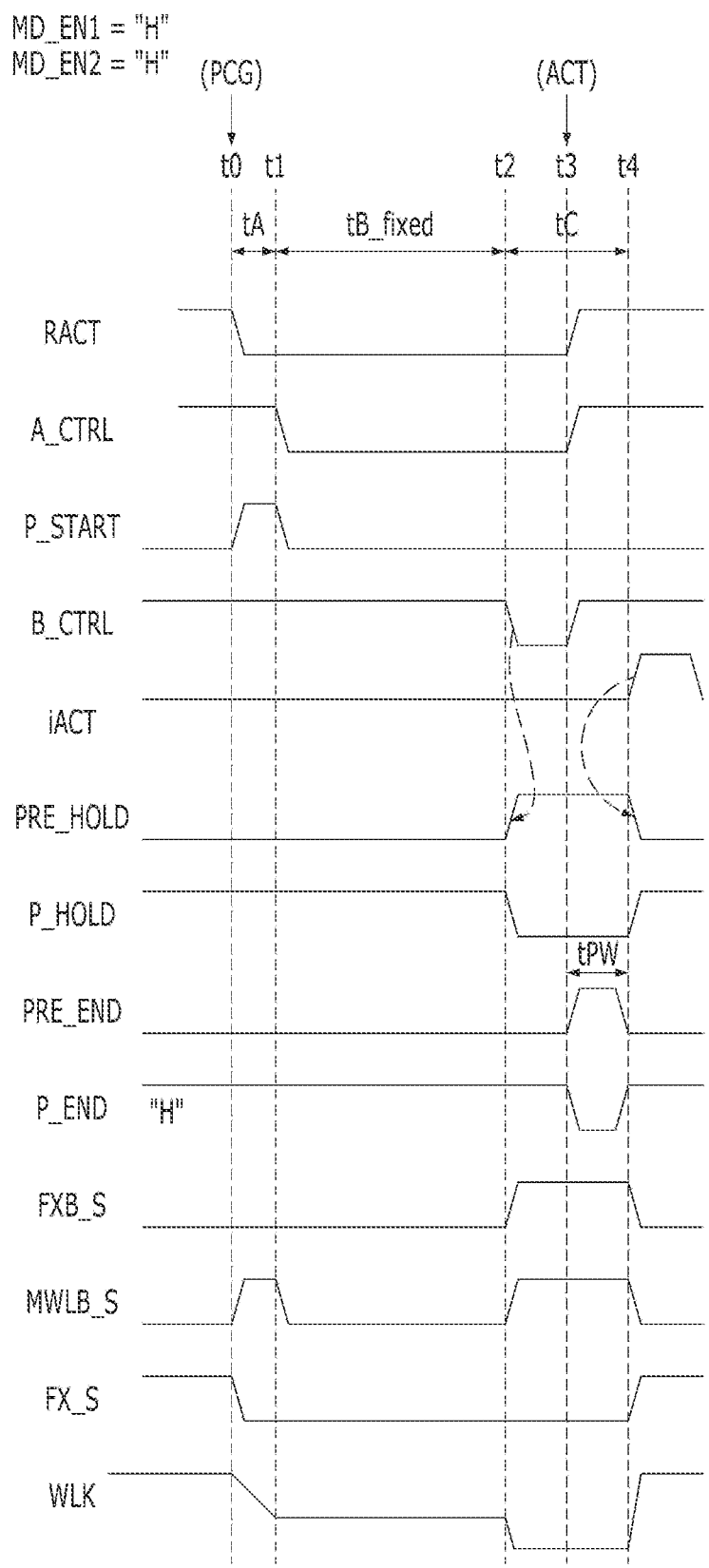
FIGS. 14A and 14B are waveform diagrams for describing an operation of a memory device according to first and second mode control signals, in accordance with another embodiment of the present invention.
Figure 14B:
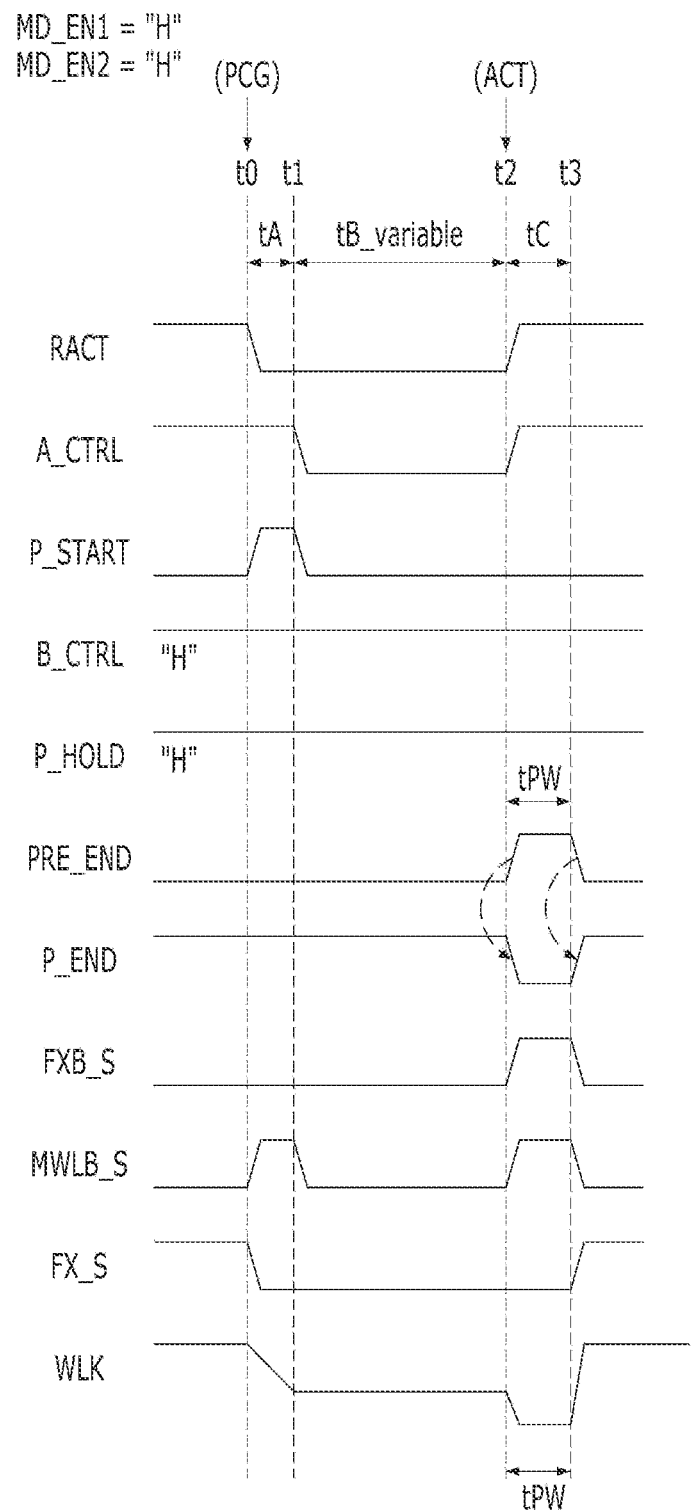

FIGS. 14A and 14B are waveform diagrams for describing an operation of the memory device 100 according to the first mode control signal MD_EN1 and the second mode control signal MD_EN2, in accordance with another embodiment of the present invention. In FIGS. 14A and 14B, both the first mode control signal MD_EN1 and the second mode control signal MD_EN2 are activated to a logic high level, and the second section tB is variable to have a time amount defined by an input of a subsequent active command ACT.

Referring to FIG. 14A, a case where a subsequent active command ACT is input after the second section tB_fixed is secured is illustrated. The second section tB_fixed is a time amount preset in consideration of the precharge-active time tRP.

At time to, when a precharge command PCG is input, the row active signal RACT is deactivated to a logic low level. The start control circuit 222 may generate the first section signal A_CTRL that becomes a logic low level after a first section tA and may generate the section start signal P_START that stays activated during the first section tA.

At time t1, the first end controller 310' of the end control circuit 224 may delay a falling edge of the first section signal A_CTRL by a preset time amount to generate the second section signal B_CTRL. At time t2, the first end controller 310' may set the first preliminary end signal PRE_HOLD to a logic high level. In response to the first mode control signal MD_EN1 of a logic low level, the first end controller 310' may output the first end signal P_HOLD by inverting the first preliminary end signal PRE_HOLD. Accordingly, the second section tB_fixed from time t1 to time t2 may be defined.

At time t3, when the active command ACT is input, the second end controller 330' may generate the second preliminary end signal PRE_END having a pulse width tPW and may output the second preliminary end signal P_END by inverting the second preliminary end signal PRE_END in response to the second mode control signal MD_EN2 of a logic high level.

Then, at time t4, the first end controller 310' may reset the first preliminary end signal PRE_HOLD to a logic high level in response to an active pulse iACT.

Referring to FIG. 14B, a case where a subsequent active command ACT is input at an interval shorter than a second section tB which is fixed is illustrated.

At time to, when the precharge command PCG is input, the start control circuit 222 may generate the first section signal A_CTRL that becomes a logic low level after the first section tA and may generate the section start signal P_START that stays activated during the first section tA.

At time t2, when the active command ACT is input, the second end controller 330' may generate the second preliminary end signal PRE_END having a pulse width tPW and may output the second end signal P_END by inverting the second preliminary end signal PRE_END in response to the second mode control signal MD_EN2 of a logic low level. Accordingly, the second section tB_variable may be defined from time t1 to time t2. At this time, since a subsequent active command ACT has been input without securing the second section tB_fixed, the second section signal B_CTRL may not transition to a logic low level while maintaining a logic high level. Accordingly, the first end controller 310' may output the first section end signal P_HOLD to be kept at a logic high level, according to the first preliminary end signal PRE_HOLD of a logic low level.

Then, at time t3, the second end controller 330' may deactivate the second preliminary end signal PRE_END to a logic low level.

According to an embodiment of the present invention, the memory device 100 may adjust the second section tB to a time amount defined by the input of the subsequent active command in the first mode control signal MD_EN1 or the second mode control signal MD_EN2. Accordingly, it is possible to alleviate the row hammer during the precharge operation of the word line while preventing fail caused by a lack of margin in the precharge-active time tRP.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device, comprising:
a plurality of word lines; and
a row control circuit configured to:
drive, in response to a precharge command, a selected word line of the word lines such that a voltage level of the selected word line decreases from a first voltage level to a second voltage level during a first section, stays at the second voltage level during a second section and decreases from the second voltage level to a third voltage level during a third section, and
keep the second section at a preset time amount, or change the second section to a time amount defined by an input of an active command according to a mode control signal which is deactivated when the precharge command and the active command are input with a precharge-active time secured, and activated when the precharge command and the active command are input regardless of the precharge-active time.

2. The memory device of claim 1, wherein the row control circuit includes:
a section control circuit configured to generate a section start signal, and generate a first section end signal or a second section end signal in response to the mode control signal,
wherein the section start signal stays activated during the first section from an input of the precharge command,
wherein the first section end signal becomes activated after the preset time amount from deactivation of the section start signal, and
wherein the second section end signal stays activated during a predetermined period from an input of the active command.

3. The memory device of claim 1, wherein the preset time amount is a preset value in consideration of a margin of an internal operation according to the precharge-active time.

4. The memory device of claim 2,
wherein the row control circuit further includes:
a driving control circuit configured to generate driving control signals for driving the selected word line according to the section start signal, the first section end signal and the second section end signal.

5. The memory device of claim 2,
wherein the section control circuit includes:
a start control circuit configured to:
generate a first section signal by delaying a row active signal by the first section, and
generate the section start signal according to the row active signal and the first section signal; and
an end control circuit configured to:
generate a first preliminary end signal based on the row active signal and the first section signal,
generate a second preliminary end signal based on the row active signal, and
output, according to the mode control signal, the first preliminary end signal as the first section end signal or the second preliminary end signal as the second section end signal,
wherein the row active signal is activated in response to the active command and deactivated in response to the precharge command.

6. The memory device of claim 5, wherein the end control circuit includes:

a first end controller configured to:
generate the first preliminary end signal based on the row active signal and the first section signal, and
mask the first preliminary end signal or output the first preliminary end signal as the first section end signal, according to the mode control signal; and
a second end controller configured to:
generate the second preliminary end signal based on the row active signal, and
mask the second preliminary end signal or output the second preliminary end signal as the second section end signal, according to the mode control signal.

7. The memory device of claim 4, wherein the driving control circuit includes:
a sub-driving control part configured to generate a sub-driving signal of the driving control signals according to the first section end signal and the second section end signal; and
a third driving control part configured to generate a main driving signal of the driving control signals according to the section start signal and the sub-driving signal.

8. The memory device of claim 7, wherein the row control circuit further includes a word line driving circuit configured to drive the selected word line according to the main driving signal and the sub-driving signal.

9. A memory device comprising:
a row active circuit configured to generate a row active signal that is activated in response to an active command and deactivated in response to a precharge command;
a section control circuit configured to:
generate a section start signal that stays activated during a first section from when the row active signal is deactivated, and
generate a first section end signal or a second section end signal in response to a mode control signal which is deactivated when the precharge command and the active command are input with a precharge-active time secured, and activated when the precharge command and the active command are input regardless of the precharge-active time, wherein the first section end signal becomes activated after a preset time amount from deactivation of the section start signal, and wherein the second section end signal stays activated during a predetermined period from when the row active signal is activated; and
a driving control circuit configured to generate driving control signals for driving, to a second voltage level, a selected word line of word lines during a second section defined by the section start signal, the first section end signal and the second section end signal.

10. The memory device of claim 9, wherein the preset time amount is a preset value in consideration of a margin of an internal operation according to the precharge-active time.

11. The memory device of claim 9, wherein the section control circuit generates the first section end signal when the mode control signal is deactivated and generates the second section end signal when the mode control signal is activated.

12. The memory device of claim 9, wherein the section control circuit includes:
a start control circuit configured to:
generate a first section signal by delaying the row active signal by the first section, and
generate the section start signal according to the row active signal and the first section signal;
a first end controller configured to:

generate a first preliminary end signal based on the row active signal and the first section signal, and mask the first preliminary end signal or output the first preliminary end signal as the first section end signal, according to the mode control signal; and a second end controller configured to:

generate a second preliminary end signal based on the row active signal, and mask the second preliminary end signal or output the second preliminary end signal as the second section end signal, according to the mode control signal.

13. The memory device of claim 12, wherein the start control circuit includes:

an inverter configured to invert the row active signal;

a delay circuit configured to delay the row active signal by the first section to generate the first section signal; and a logic gate configured to output the section start signal by performing a logic AND operation on an output of the inverter and an output of the delay circuit.

14. The memory device of claim 12, wherein the first end controller includes:

an internal active circuit configured to generate an active pulse after a predetermined time from when the row active signal is activated;

a delay circuit configured to delay the first section signal by the preset time amount to generate the second section signal;

a latch configured to generate the first preliminary end signal, which is set according to the second section signal and reset according to the active pulse; and a first masking circuit configured to mask the first preliminary end signal or output the first preliminary end signal as the first section end signal, according to the mode control signal.

15. The memory device of claim 12, wherein the second end controller includes:

a pulse width control circuit configured to generate the second preliminary end signal, which has a pulse width corresponding to the predetermined period, when the row active signal is activated; and a second masking circuit configured to mask the second preliminary end signal or output the second preliminary end signal as the second section end signal, according to the mode control signal.

16. An operating method of a memory device, comprising:

driving a word line according to a precharge command such that a voltage level of the word line decreases from a first voltage level to a second voltage level during a first section;

driving the word line such that the voltage level of the word line stays at the second voltage level during a second section after the first section;

keeping an amount of the second section to a preset time amount or changing the amount as defined by an active command, according to a mode control signal which is deactivated when the precharge command and the active command are input with a precharge-active time secured, and activated when the precharge command and the active command are input regardless of the precharge-active time; and driving the word line such that the voltage level of the word line decreases from the second voltage level to a third voltage level during a third section.

17. The operating method of claim 16, wherein the preset time amount is a preset value in consideration of a margin of an internal operation according to the precharge-active time.

18. The operating method of claim 16, wherein the keeping or changing includes:

generating a section start signal;

generating a first section end signal or a second section end signal in response to the mode control signal; and defining the second section according to the section start signal, the first section end signal and the second section end signal, wherein the section start signal stays activated during the first section from an input of the precharge command, wherein the first section end signal becomes activated after the preset time amount from deactivation of the section start signal, and wherein the second section end signal stays activated during a predetermined period from an input of the active command.

19. The operating method of claim 18, wherein the first section end signal is generated when the mode control signal is deactivated and the second section end signal is generated when the mode control signal is activated.

* * * * *